US012069850B2

(12) United States Patent
Liu

(10) Patent No.: US 12,069,850 B2
(45) Date of Patent: Aug. 20, 2024

(54) SEMICONDUCTOR STRUCTURE, MANUFACTURING METHOD THEREOF, AND MEMORY HAVING BIT LINE CONDUCTING LAYERS COVERING THE BIT LINE CONTACT LAYER AND THE INSULATING LAYER

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 344 days.

(21) Appl. No.: 17/523,084

(22) Filed: Nov. 10, 2021

(65) Prior Publication Data

US 2022/0122990 A1 Apr. 21, 2022

Related U.S. Application Data

(63) Continuation of application No. PCT/CN2021/109353, filed on Jul. 29, 2021.

(30) Foreign Application Priority Data

Oct. 15, 2020 (CN) .......................... 202011104467.2
Jan. 21, 2021 (CN) .......................... 202110083678.0

(51) Int. Cl.
*H01B 12/00* (2006.01)
*H10B 12/00* (2023.01)
(52) U.S. Cl.
CPC ........... *H10B 12/485* (2023.02); *H10B 12/34* (2023.02); *H10B 12/482* (2023.02)
(58) Field of Classification Search
CPC ..... H10B 12/34; H10B 12/482; H10B 12/485
(Continued)

(56) References Cited

U.S. PATENT DOCUMENTS 7,595,262 B2  9/2009  Schlosser
9,034,745 B2  5/2015  Im
(Continued)

FOREIGN PATENT DOCUMENTS

CN    107240586 A    10/2017
CN    107369686 A    11/2017
(Continued)

OTHER PUBLICATIONS

State Intellectual Property Office of the People's Republic of China, First Office Action and Search Report Issued in Application No. 202110083678.0, May 11, 2024, 8 pages.

*Primary Examiner* — Hoai V Pham
(74) *Attorney, Agent, or Firm* — Kilpatrick Townsend & Stockton LLP

(57) ABSTRACT

A semiconductor structure and a manufacturing method thereof are provided. The semiconductor structure includes a substrate, in which a plurality of active areas arranged in an array are provided; buried word lines located in the substrate, in which each of the active areas intersects with two of the buried word lines; grooves located in an upper surface of the substrate, in which each of the grooves is located between two of the buried word lines in each of the active areas; bit line contact layers filling the grooves; insulating layers distributed between two of the grooves, in which a thickness between upper surfaces of the insulating layers and the upper surface of the substrate is smaller than a thickness between upper surfaces of the bit line contact layers and the upper surface of the substrate; and bit line conducting layers, covering the bit line contact layers and the insulating layers.

20 Claims, 7 Drawing Sheets

(58) Field of Classification Search
USPC .......................................... 257/906, 907, 908
See application file for complete search history.

(56) References Cited

U.S. PATENT DOCUMENTS

| | | |
|---|---|---|
| 9,570,391 B2 | 2/2017 | Im |
| 2008/0102578 A1 | 5/2008 | Schlosser |
| 2011/0037111 A1 | 2/2011 | Kim et al. |
| 2011/0241102 A1 | 10/2011 | Cho et al. |
| 2013/0256904 A1 | 10/2013 | Im |
| 2013/0320558 A1 | 12/2013 | Kim et al. |
| 2014/0061939 A1 | 3/2014 | Yu et al. |
| 2015/0214147 A1 | 7/2015 | Im |
| 2019/0326278 A1* | 10/2019 | Lee .................. H01L 21/823807 |
| 2021/0082923 A1 | 3/2021 | He et al. |

FOREIGN PATENT DOCUMENTS

| | | |
|---|---|---|
| CN | 107546226 A | 1/2018 |
| CN | 207852674 U | 9/2018 |
| CN | 109979940 A | 7/2019 |
| CN | 209282201 U | 8/2019 |
| CN | 110890369 A | 3/2020 |
| CN | 110931486 A | 3/2020 |
| CN | 111048467 A | 4/2020 |
| CN | 210296377 U | 4/2020 |
| CN | 111223860 A | 6/2020 |
| CN | 111584432 A | 8/2020 |
| CN | 111640746 A | 9/2020 |
| CN | 111640759 A | 9/2020 |
| KR | 20110011833 A | 2/2011 |

* cited by examiner

SEMICONDUCTOR STRUCTURE, MANUFACTURING METHOD THEREOF, AND MEMORY HAVING BIT LINE CONDUCTING LAYERS COVERING THE BIT LINE CONTACT LAYER AND THE INSULATING LAYER

CROSS-REFERENCE TO RELATED APPLICATIONS

The present application is a U.S. continuation application of International Application No. PCT/CN2021/109353, filed on Jul. 29, 2021, which claims priority to Chinese Patent Application No. 202110083678.0, filed on Jan. 21, 2021, and Chinese Patent Application No. 202011104467.2, filed on Oct. 15, 2020. International Application No. PCT/CN2021/109353, Chinese Patent Application No. 202110083678.0, and Chinese Patent Application No. 202011104467.2 are incorporated herein by reference in their entireties.

TECHNICAL FIELD

The embodiments of the disclosure relate to the technical field of semiconductors, and in particular to a semiconductor structure, a manufacturing method of the semiconductor structure, and a memory.

BACKGROUND

A Dynamic Random Access Memory (DRAM), as a semiconductor memory device, has been widely used in various electronic devices at present.

The DRAM typically consists of many repetitive storage cells, each of which typically includes a capacitor and a transistor with a gate connected to a Word Line (WL), a drain connected to a Bit Line (BL), and a source connected to the capacitor. A voltage signal on the WL may control the transistor to be turned on or off, so that data information stored in the capacitor may be read through the BL, or the data information may be written into the capacitor for storage through the BL.

With the continuous increase of the integration level in the semiconductor manufacturing process, the improvement of the integration density of the memory has become a trend. However, under the condition that the size of the memory becomes smaller and smaller, correspondingly, the contact area of BL contact structures formed in the semiconductor manufacturing process becomes smaller and smaller, so that the contact resistance of the BL contact structures is increased, and the performance of the memory is influenced.

SUMMARY

In a first aspect, an embodiment of the disclosure provides a semiconductor structure, which includes a substrate, buried word lines (WLs), grooves, bit line (BL) contact layers, insulating layers and BL conducting layers.

A plurality of active areas arranged in an array are provided in the substrate.

The buried WLs are located in the substrate, and each of the active areas intersects with two of the buried WLs.

The grooves are located in an upper surface of the substrate, in which each of the grooves is located between two of the buried WLs in each of the active areas.

The BL contact layers fill the grooves.

The insulating layers are distributed between two of the grooves, and a thickness between upper surfaces of the insulating layers and the upper surface of the substrate is smaller than a thickness between upper surfaces of the BL contact layers and the upper surface of the substrate.

The BL conducting layers cover the BL contact layers and the insulating layers.

In a second aspect, an embodiment of the disclosure provides a manufacturing method of a semiconductor structure. The manufacturing method includes the following operations.

A substrate is provided. In the substrate, buried WLs and a plurality of active areas arranged in an array are provided. Each of the active areas intersects with two of the buried WLs. Grooves are provided in an upper surface of the substrate by etching, and each of the grooves is located between two of the buried WLs in each of the active areas.

BL contact layers and insulating layers are deposited, in which the BL contact layers fill the grooves, and the insulating layers are distributed between two of the grooves.

The insulating layers are selectively etched, so that a thickness between upper surfaces of the insulating layers and the upper surface of the substrate is smaller than a thickness between upper surfaces of the BL contact layers and the upper surface of the substrate.

BL conducting layers are deposited, in which the BL conducting layers cover the BL contact layers and the insulating layers.

In a third aspect, an embodiment of the disclosure provides a memory, which includes the semiconductor structure as provided in the first aspect.

BRIEF DESCRIPTION OF THE DRAWINGS

In order to describe the technical solutions in the embodiments of the disclosure or the relevant art more clearly, the drawings required to be used in descriptions about the embodiments of the disclosure or the relevant art will be simply introduced below. Apparently, the drawings described below are only some embodiments of the disclosure, and other drawings may further be obtained by those of ordinary skill in the art according to the drawings without creative work.

DETAILED DESCRIPTION

Figure 1:
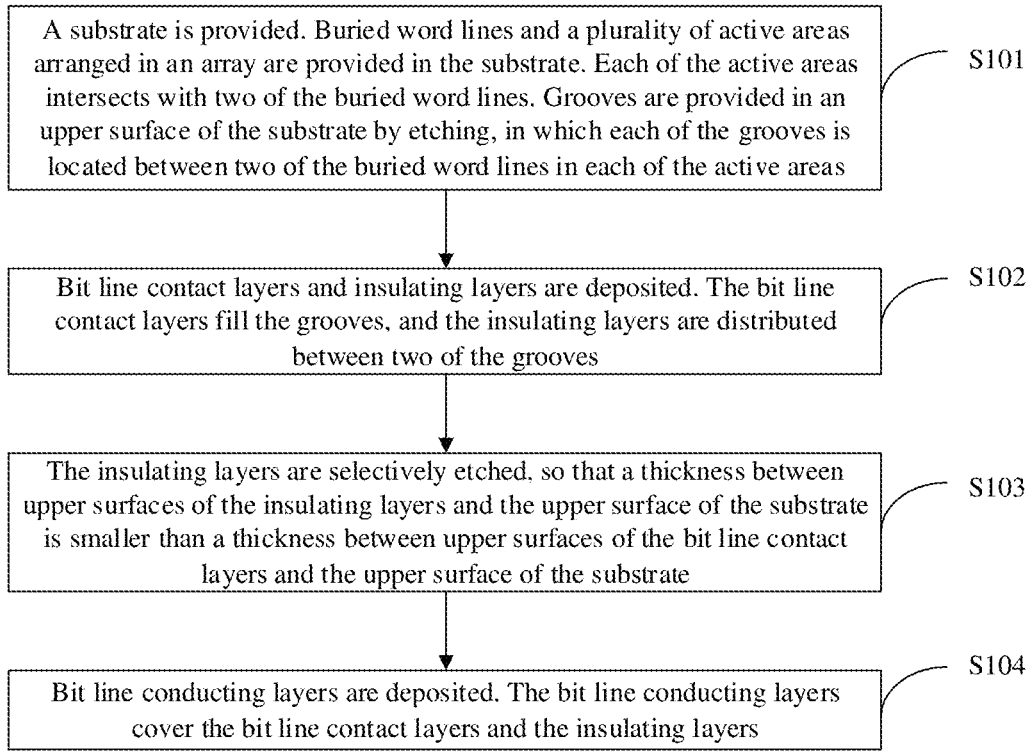
FIG. 1 is a process flow diagram of a manufacturing method of a semiconductor device according to an embodiment of the disclosure.

In order to make the purpose, the technical solutions and the advantages of the embodiments of the disclosure clearer, the technical solutions in the embodiments of the disclosure will be clearly and completely described below with reference to the drawings showing the embodiments of the disclosure. Apparently, the described embodiments are only a part of and not all of embodiments of the disclosure. All other embodiments obtained by those of ordinary skill in the art based on the embodiments of the disclosure without creative efforts shall fall within the protection scope of the disclosure.

A DRAM, as a common semiconductor memory device, typically consists of many repetitive storage cells. Each storage cell is mainly composed of a transistor and a capacitor controlled by the transistor. The storage cells are arranged in an array form, and each storage cell is electrically connected with one another through a WL and a BL. With the increasing development of the electronic products toward lightness, thinness, shortness and smallness, the design of the DRAM needs to meet the requirements of high integration level and high density to develop towards miniaturization. In order to improve the integration degree of the DRAM to accelerate the operation speed of an assembly and meet the requirements of consumers for miniaturized electronic devices, the DRAM with buried WLs has been developed in recent years to meet the above various requirements.

However, as the size of the DRAM is becoming smaller and smaller, in existing semiconductor manufacturing methods, the contact area of BL contact structures and BL conducting layers is becoming smaller and smaller, so that the BL contact structures generate relatively high contact resistance. As a result, it is difficult to perform normal data reading and writing of the storage cells, and the performance of the semiconductor device is affected.

In order to solve the technical problem, the embodiment of the disclosure provides a semiconductor structure applied to a semiconductor memory device, the contact resistance of BL contact structures may be effectively reduced by increasing the contact area between BL conducting layers and the BL contact structures, and thus the performance of the memory is improved.

The semiconductor structure and a manufacturing method of the semiconductor structure of the disclosure will be described in further detail below with reference to the accompanying drawings and specific embodiments. The advantages and features of the disclosure will be clearer from the following description. It is to be noted that the drawings are made in a very simplified form and use non-exact scale merely for the purpose of conveniently and clearly assisting in the description of the embodiments of the disclosure. It should be understood that in the following description, references to "on" and "under" various layers may be made based on the drawings. It should be understood, however, that the spatially relative terms are intended to encompass different orientations in use or operation in addition to the orientation of the device depicted in the figures. For example, if the device in the drawings is inverted or otherwise differently positioned (e.g., rotated), the exemplary term "on" may also include "under" and other orientation relationships. When a layer, region, pattern, or structure is referred to as being "on" a substrate, layer, region, and/or pattern, it may be directly disposed on another layer or substrate, and/or intervening layers may also be present. Similarly, when a layer is referred to as being "under" another layer, it may be directly disposed under the other layer, and/or one or more intervening layers may also be present.

Referring to FIG. 1, FIG. 1 is a process flow diagram of a manufacturing method of a semiconductor device according to an embodiment of the disclosure. In the embodiment of the disclosure, the manufacturing method of the semiconductor device includes the following operations.

In S101, a substrate is provided, in which buried WLs and a plurality of active areas arranged in an array are provided in the substrate. Each of the active areas intersects with two of the buried WLs. Moreover, grooves are provided in an upper surface of the substrate by etching, and each of the grooves is located between two of the buried WLs in each of the active areas.

Figure 2:
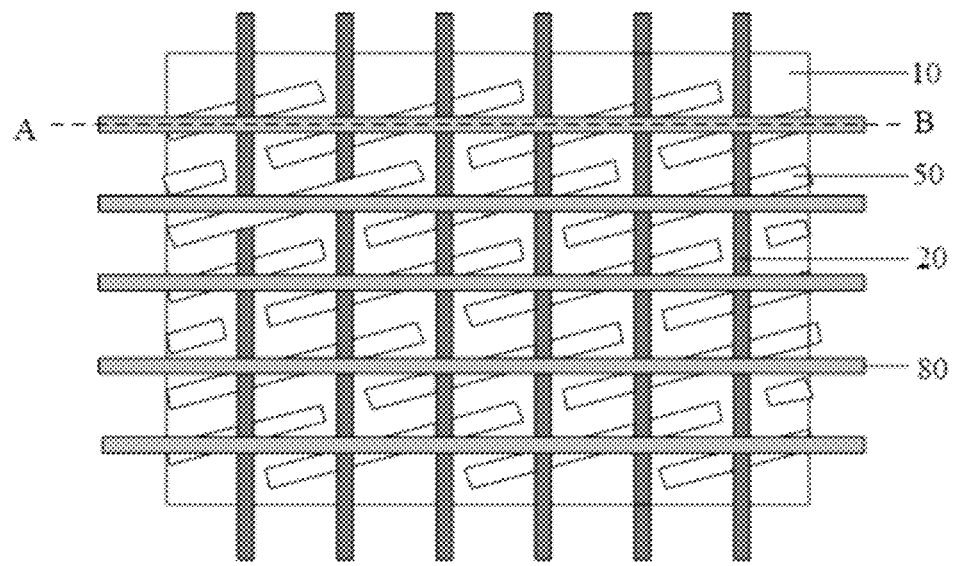
FIG. 2 is a distribution schematic diagram showing distribution of WLs of a semiconductor device according to an embodiment of the disclosure.

For a better understanding of the disclosure, reference is made to FIG. 2. FIG. 2 is a schematic diagram showing distribution WLs of a semiconductor device according to an embodiment of the disclosure. In the embodiment of the disclosure, a plurality of active areas 50 arranged in an array, a plurality of buried WLs 20 and BLs 80 are provided in the substrate 10. Each of the active areas 50 intersects with two of the buried WLs 20.

Optionally, the substrate 10 may be made of any material suitable for forming the semiconductor device, for example, a p-type silicon substrate, an n-type silicon substrate, a silicon-germanium substrate, or the like. This is not limited in the embodiment, and may be selected according to practical circumstances.

Figure 3:
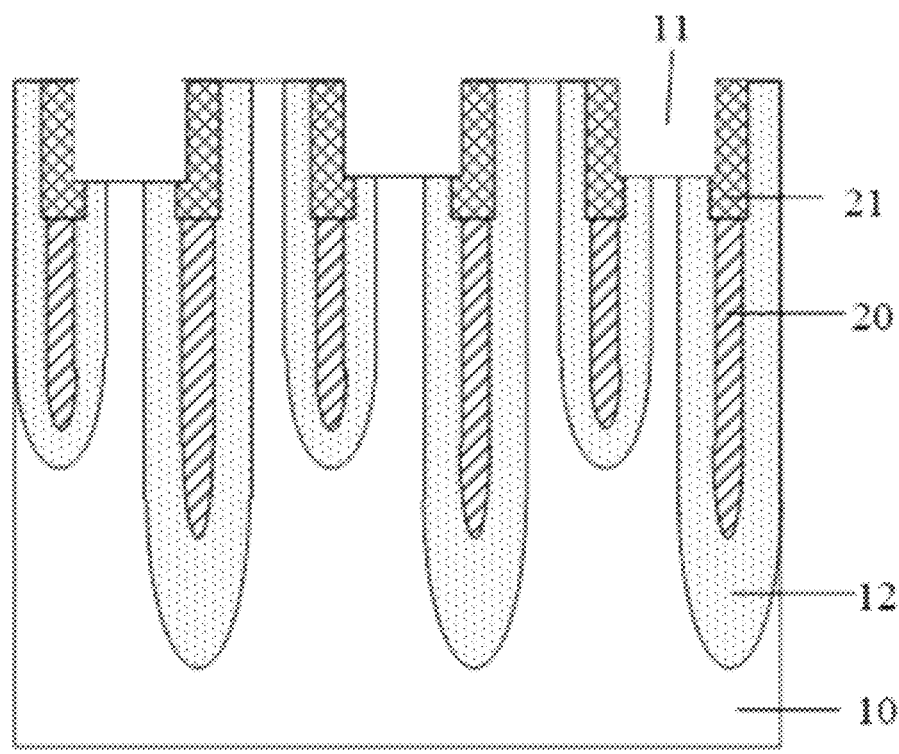
FIG. 3 is a schematic cross-sectional view of a semiconductor device shown in FIG. 2 in the AB direction when S101 is executed according to an embodiment of the disclosure.

Referring to FIG. 3, FIG. 3 is a schematic cross-sectional view of a semiconductor device shown in FIG. 2 in the AB direction when S101 is executed according to an embodiment of the disclosure.

In one possible implementation mode, there are a plurality of spaced apart isolation structures 12 in the substrate 10, which isolate a plurality of active areas 50 in the substrate 10. The number of the isolation structures 12 and the number of the active areas 50 may be set according to actual needs. In other embodiments, the shape and arrangement of the active areas 50 may also be adjusted according to actual needs, for example, the active areas 50 may also be of a broken line type or a wavy type.

The isolation structures 12 may be Shallow Trench Isolation (STI) structures, each isolation structure 12 includes an isolation trench formed in the substrate 10 and an isolation medium, such as silicon oxide or the like, filled the isolation trench.

The buried WLs 20 are formed in the substrate 10, extend parallel to the surface of the substrate 10, and intersect with the active areas 50 in the substrate 10, and the parts, intersecting with the active areas 50, of the buried WLs 20 may be used as sources of transistors of the memory.

In one possible implementation mode of the disclosure, when the buried WLs 20 are formed, buried WL holes may be formed first and then filled with materials of gate electrode layers and WL conducting layers.

In the embodiment of the disclosure, a plurality of grooves 11 are formed in the substrate 10 by etching, and each of the grooves 11 is located between two of the buried WLs 20 in each of the active areas 50. The grooves 11 extend in a direction parallel to the surface of the substrate 10.

Optionally, the surface of the substrate 10 may be etched by using a dry etching process and/or a wet etching process to form the grooves 11. The cross sections of the grooves 11 may be in a U shape, a rectangular shape, an inverted trapezoid shape and any shape suitable for the performance of the device.

It should be noted that the size of the openings of the grooves 11 may be set according to actual needs.

In FIG. 3, the substrate 10 further includes WL isolation layers 21. The WL isolation layers 21 may be used to isolate the buried WLs 20 from other structures subsequently formed over the substrate. In an exemplary implementation mode, the WL isolation layers 21 may be formed from silicon nitride or silicon oxynitride. The two materials have relatively good insulating properties, and silicon-nitrogen bonds in the two materials facilitate selective etching.

Optionally, the WL isolation layers 21 may be deposited by a Chemical Vapor Deposition (CVD) process. In the deposition process, the grooves over the buried WLs 20 are filled first, and then the upper surface of the whole semiconductor substrate 101 is covered, so that a complete WL isolation layer 21 is formed.

In an exemplary embodiment, after depositing the WL isolation layer 21, the upper surface of the WL isolation layer 21 may also be planarized by a Chemical Mechanical Polishing (CMP) process to obtain a planarized film layer.

After the complete WL isolation layer 21 is formed, the WL isolation layer 21 and/or the substrate 10 may be selectively etched between two of the buried WLs 20 located in the same active area to form the grooves 11.

In S102, BL contact layers and insulating layers are deposited, in which the BL contact layers fill the grooves, and the insulating layers are distributed between two of the grooves.

In the embodiment of the disclosure, the BL contact layers are deposited on the substrate containing the grooves 11, and the BL contact layers fill the grooves 11 and are distributed over the grooves 11.

The BL contact layers have a certain thickness relative to the upper surface of the WL isolation layers 21.

Figure 4:
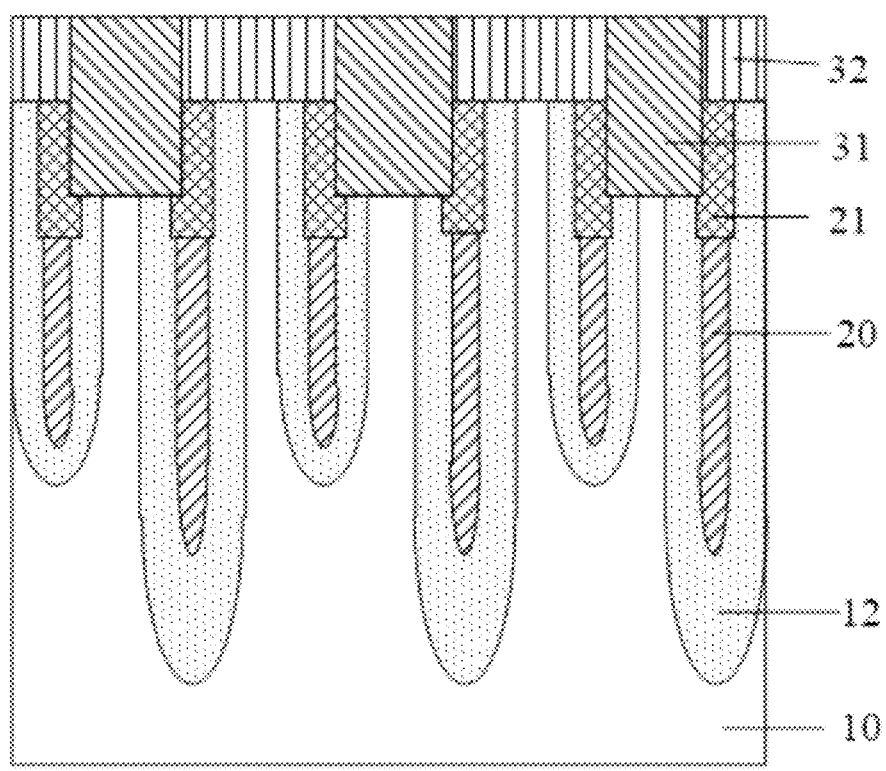
FIG. 4 is a schematic cross-sectional view of a semiconductor device shown in FIG. 2 in the AB direction when S102 is executed according to an embodiment of the disclosure.

Referring to FIG. 4, FIG. 4 is a schematic cross-sectional view of a semiconductor device shown in FIG. 2 in the AB direction when S102 is executed according to an embodiment of the disclosure.

As shown in FIG. 4, in the embodiment of the disclosure, the material for the BL contact layers 31 may include polysilicon (poly).

In one possible implementation mode, polysilicon may fill the grooves 11 and is distributed over the grooves 11 to form BL contact structures.

The insulating layers 32 are arranged between two of the BL contact structures 31. The thickness between the upper surfaces of the insulating layers 32 and the upper surface of the substrate 10 is smaller than the thickness between the upper surfaces of the BL contact structures and the upper surface of the substrate 10.

Polysilicon has relatively good conductivity and relatively good contact performance with the substrate 10.

The insulating layers 32 may be formed by using an oxide.

In S103, the insulating layers are selectively etched, so that the thickness between the upper surfaces of the insulating layers and the upper surface of the substrate is smaller than the thickness between the upper surfaces of the BL contact layers and the upper surface of the substrate.

In the embodiment of the disclosure, after the BL contact layers 31 and the insulating layers 32 are deposited, the insulating layer 32 may be selectively etched, so that part of the side walls of the BL contact structures may be exposed.

Figure 5:
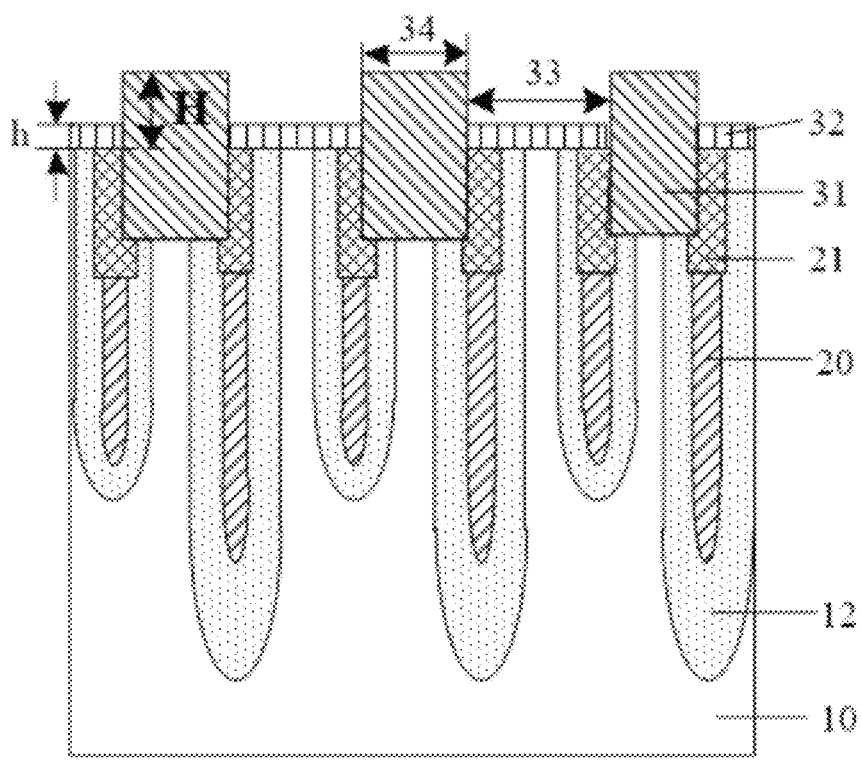
FIG. 5 is a schematic cross-sectional view of a semiconductor device shown in FIG. 2 in the AB direction when S103 is executed according to an embodiment of the disclosure.

Referring to FIG. 5, FIG. 5 is a schematic cross-sectional view of a semiconductor device shown in FIG. 2 in the AB direction when S103 is executed according to an embodiment of the disclosure. In the embodiment of the disclosure, the insulating layers in a first region 33 are selectively etched, so that the thickness h between the upper surfaces of the insulating layers in the first region 33 and the upper surface of the substrate 10 is smaller than the thickness H between the upper surfaces of the BL contact layers in a second region 34 and the upper surface of the substrate 10.

The upper region between two of the grooves 11 is the first region 33; and the region over each groove 11 is the second region 34.

After the insulating layers 32 are selectively etched, the BL contact layers 31 would form protruded BL contact structures, and the protruded BL contact structures expose part of side walls in the etching regions.

Exemplarily, in the embodiment, the oxide disposed on two sides of the BL contact structures may be etched, so that the upper surface of the oxide is lower than the upper surfaces of the BL contact structures, and part of the side walls of the BL contact structures are exposed.

In S104, BL conducting layers are deposited, in which the BL conducting layers cover the BL contact layers and the insulating layers.

In the embodiment of the disclosure, after the insulating layers 32 are selectively etched, the BL conducting layers may be deposited on the surfaces of the etched BL contact layers and the surfaces of the etched insulating layers.

The deposited BL conducting layers may cover the upper surfaces of the insulating layers, the upper surfaces of the BL contact structures and part of the side walls of the BL contact structures.

Optionally, the material of the BL conducting layers may include one or more of tungsten, titanium tungsten and titanium nitride. When a plurality of materials are used, the BL conducting layers may be formed by simultaneous deposition of the plurality of materials, and various material components are uniformly distributed in the BL conducting layers.

Figure 6:
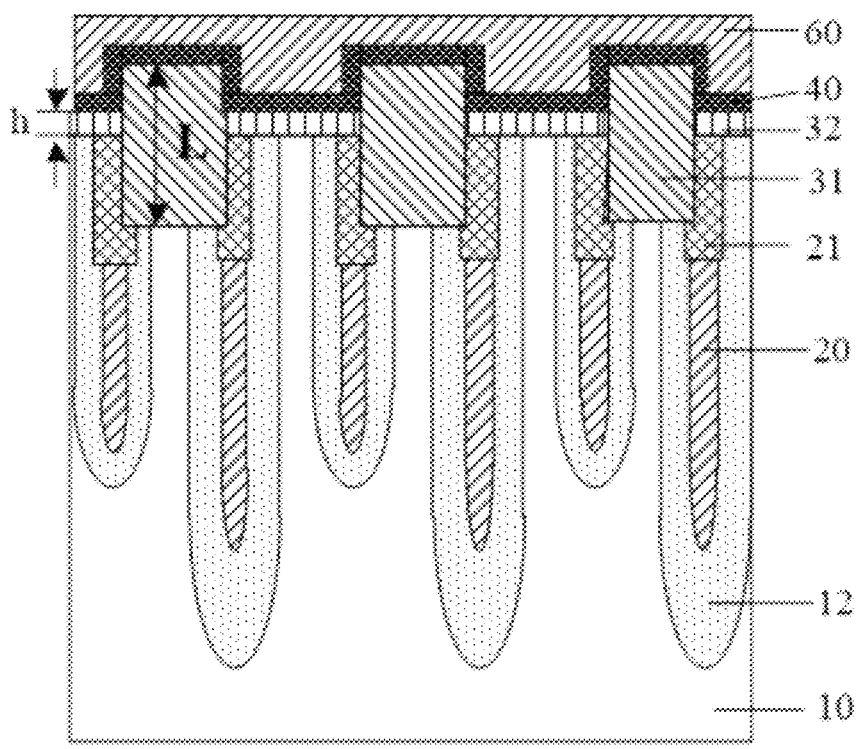
FIG. 6 is a schematic cross-sectional view of a semiconductor device shown in FIG. 2 in the AB direction when S104 is executed according to an embodiment of the disclosure.

Referring to FIG. 6, FIG. 6 is a schematic cross-sectional view of a semiconductor device shown in FIG. 2 in the AB direction when S104 is executed according to an embodiment of the disclosure. In the embodiment of the disclosure, the BL conducting layers may include metal barrier layers 40 and metal conducting layers 60.

The metal barrier layers 40 may be deposited on the upper surfaces of the BL contact layers, so that the metal barrier layers 40 may cover the surfaces of both the BL contact layers 31 and the insulating layers 32. Then the metal conducting layers 60 are deposited on the surfaces of the metal barrier layers 40, so that the metal conducting layers 60 cover the surfaces of the metal barrier layers 40.

Optionally, a material of the metal barrier layers 40 includes titanium nitride TiN, and a material of the metal conducting layers 60 includes tungsten W.

Optionally, the metal conducting layers 60 and the metal barrier layers 40 may be deposited by a Physical Vapor Deposition (PVD) process.

It can be understood that the surface structures of the BL contact layers in an existing semiconductor device are changed through selective etching of the insulating layers, so that the side walls of the BL contact structures may also be in contact with the BL conducting layers, the contact area of the BL conducting layers and the BL contact structures may be effectively increased, the contact resistance of the BL contact structures is reduced, and the performance of the memory is improved.

On the other hand, in the embodiment of the disclosure, the BL contact structures may be improved by selectively etching the insulating layers. The process flow is simple, and the practicability is high.

Based on the description in the above embodiment, referring to FIG. 6 again, in one possible implementation mode of the disclosure, the ratio of the thickness h of the insulating layers 32 to the thickness L of the BL contact structures is within a predetermined value interval.

Optionally, the value interval is (¼, ½), i.e., in the embodiment of the disclosure, the ratio of the thickness of the insulating layers 32 to the thickness of the BL contact structures may be within the value interval (¼, ½).

Figure 7:
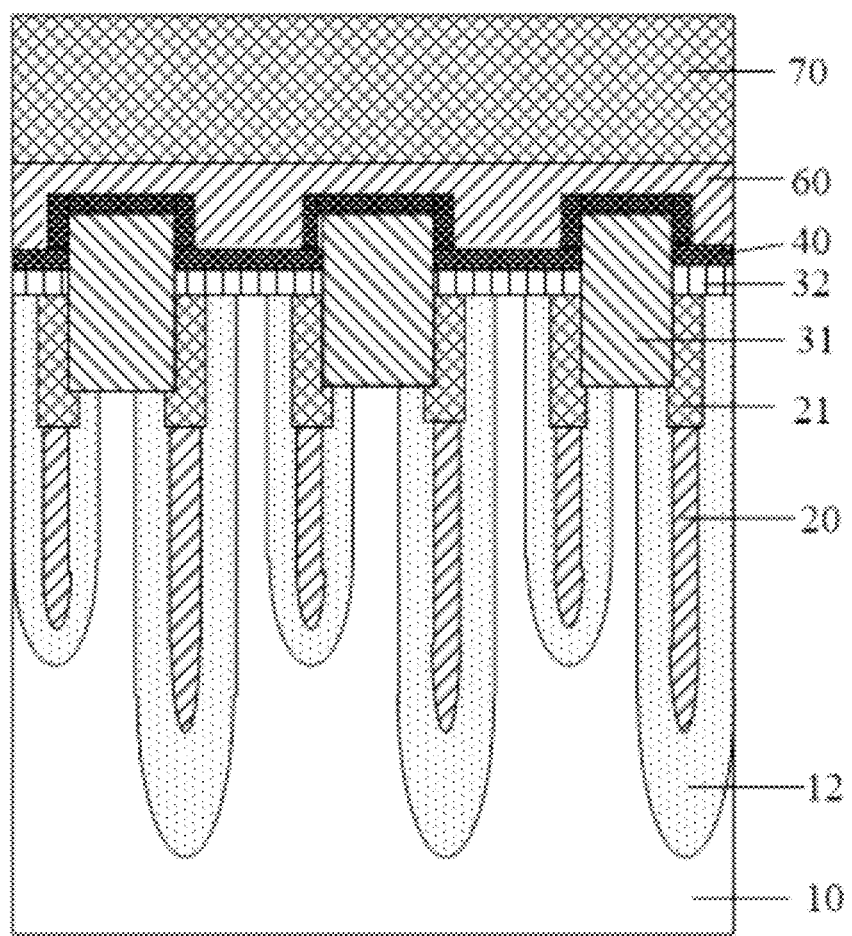
FIG. 7 is a schematic cross-sectional view of a semiconductor device shown in FIG. 2 in the AB direction during manufacturing according to an embodiment of the disclosure.

Based on the description in the above embodiment, referring to FIG. 7, FIG. 7 is a schematic cross-sectional view of a semiconductor device shown in FIG. 2 in the AB direction during manufacturing according to an embodiment of the disclosure. In one possible implementation mode of the disclosure, after the BL conducting layers are deposited, the manufacturing method of the semiconductor device further includes the following operations.

Dielectric layers 70 are deposited, in which the dielectric layers 70 cover the surfaces of the BL conducting layers.

In an exemplary embodiment, a material for the dielectric layers 70 may include silicon nitride (SiN). In addition, the dielectric layers 70 may also be formed from silicon dioxide or silicon oxynitride, or be formed from more of silicon nitride, silicon dioxide, and silicon oxynitride. When the dielectric layers 70 are formed from multiple materials, it may be a stack of multiple layers which each are formed from a single material.

In one possible implementation mode of the disclosure, after the dielectric layers 70 are formed, BLs fabrication may be performed. Silicon nitride, silicon dioxide and silicon oxynitride all have good insulativity and isolation, so that the BLs may be insulated and isolated.

Based on the manufacturing method of the semiconductor device described in the above embodiment, the disclosure also provides a semiconductor device. Reference may be made to FIG. 7 for details. In the embodiment of the disclosure, the semiconductor device includes a substrate 10, buried WLs 20, grooves 11, BL contact layers, and BL conducting layers.

A plurality of active areas 50 arranged in an array are provided in the substrate 1. The buried WLs 20 are located in the substrate 10, and each active area 50 intersects with two of the buried WLs 20. The grooves 11 are located in the upper surface of the substrate 10, and each of the grooves 11 is located between two of the buried WLs 20 in each active area 50.

Exemplarily, the substrate 10 may be made of any material suitable for forming the semiconductor device, for example, a p-type silicon substrate, an n-type silicon substrate, a silicon germanium substrate, or the like, without limitation in the embodiment, and may be selected according to practical circumstances.

Isolation structures 12 are formed in the substrate 10, and the isolation structures 12 isolate a plurality of active areas 50 in the substrate 10. The active areas 50 are arranged in the substrate 10 in an array form. In other embodiments, the shape and arrangement of the active areas 50 may also be adjusted according to actual needs, for example, the active areas 50 may also be of a broken line type or a wavy type.

The isolation structures 12 may be STI. Each isolation structure 12 includes an isolation trench formed in the substrate 10 and an isolation medium, such as silicon oxide or the like, filling the isolation trench.

The buried WLs 20 are formed in the substrate 10, and interact with the active areas 50 in the substrate 10.

When the buried WLs 20 are formed, buried WL holes may be formed first and then filled with materials of gate electrode layers and WL conducting layers.

Further, WL isolation layers 21 are provided in the substrate 10. The WL isolation layers 21 may be used to isolate the buried WLs 20 from other structures subsequently formed over the substrate. In an exemplary implementation mode, the WL isolation layers 21 may be made of silicon nitride or silicon oxynitride. These two materials have relatively good insulating properties, and silicon-nitrogen bonds in the two materials facilitate selective etching.

After the complete WL isolation layer 21 is formed, the WL isolation layer 21 and/or the substrate 10 may be selectively etched between the two buried WLs 20 located in the same active area to form the grooves 11.

The BL contact layers may be formed from polysilicon. Polysilicon fills the grooves 11 and is distributed over the grooves 11 to form the BL contact structures.

The semiconductor structure further includes insulating layers 32, in which the insulating layers 32 are filled between two of the BL contact structures 31.

The thickness between the upper surfaces of the insulating layers 32 and the upper surface of the substrate 10 is smaller than the thickness between the upper surfaces of the BL contact layers 31 and the upper surface of the substrate 10. That is, the upper surfaces of the insulating layers 32 are lower than the upper surfaces of the BL contact structures 31.

The BL conducting layers include metal barrier layers 40 and metal conducting layers 60.

The metal barrier layers 60 cover the surfaces of both the BL contact layers 31 and the insulating layers 32. The metal conducting layers 60 cover the surfaces of the metal barrier layers 40.

Optionally, a material for the metal barrier layers 40 includes titanium nitride TiN. A material for the metal conducting layers 60 includes tungsten W.

It can be understood that the upper surfaces of insulating layers 32 are lower than the upper surfaces of the BL contact layers 31, so that the side walls of the BL contact layers 31 may also be in contact with the BL conducting layers, the contact area of the BL conducting layers and the BL contact layers 31 may be effectively increased, the contact resistance of the BL contact layers 31 may be reduced, and the performance of the memory is improved.

Based on the description in the above embodiment, in one possible implementation mode of the disclosure, referring to FIG. 6, the ratio of the thickness h of the insulating layers 32 to the thickness L of the BL contact structures is within a predetermined value interval.

Optionally, the value interval is (¼, ½), i.e., in the embodiment of the disclosure, the ratio of the thickness of the insulating layers 32 to the thickness of the BL contact structures 31 may be within the value interval (¼, ½).

In one possible implementation mode of the disclosure, the semiconductor device further includes dielectric layers 70, in which the dielectric layers 70 cover the surfaces of the BL conducting layers.

In an exemplary embodiment, a material for the dielectric layers 70 may include SiN. When the dielectric layers 70 are formed from multiple materials, it may be a stack of multiple layers which each are formed from a single material.

It can be understood that with the semiconductor device provided by the embodiment of the disclosure, the surface structures of the BL contact layers in an existing semiconductor device are changed, so that the side walls of the BL contact structures 31 in the BL contact layers may also be in contact with the BL conducting layers, the contact area of the BL conducting layers and the BL contact structures 31 may be effectively increased, the contact resistance of the BL contact structures 31 is reduced, and the performance of the memory is improved. On the other hand, in the embodiment of the disclosure, the BL contact structures may be improved by selectively etching the insulating layers. The process flow is simple, and the practicability is high.

Finally, it is to be noted that the above embodiments are only used to illustrate the technical solutions of the disclosure and not to limit the same. Although the disclosure has been described in detail with reference to embodiments, it will be understood by those of ordinary skill in the art that the technical solutions described in the embodiments can still be modified, or part or all of the technical features can be equivalently replaced. Such modifications or replacements do not make the essence of the corresponding technical solutions deviate from the scope of the technical solution of each embodiment of the disclosure.

The invention claimed is:

1. A semiconductor structure, comprising:
a substrate, wherein a plurality of active areas arranged in an array are provided in the substrate;
buried word lines, located in the substrate, wherein each of the active areas intersects with two of the buried word lines;
grooves, located in an upper surface of the substrate, wherein each of the grooves is located between two of the buried word lines in each of the active areas;
bit line contact layers, filling the grooves;
insulating layers, distributed between two of the grooves, wherein a thickness between upper surfaces of the insulating layers and the upper surface of the substrate is smaller than a thickness between upper surfaces of the bit line contact layers and the upper surface of the substrate; and
bit line conducting layers, covering the bit line contact layers and the insulating layers.

2. The semiconductor structure of claim 1, wherein a material for the bit line contact layers comprises polysilicon which fills the grooves and is distributed over the grooves to form bit line contact structures.

3. The semiconductor structure of claim 2, wherein the insulating layers are formed from an oxide which is filled between two of the bit line contact structures, and a thickness between an upper surface of the oxide and the upper surface of the substrate is smaller than a thickness between upper surfaces of the bit line contact structures and the upper surface of the substrate.

4. The semiconductor structure of claim 3, wherein the bit line conducting layers cover the upper surface of the oxide, the upper surfaces of the bit line contact structures and part of side walls of the bit line contact structures.

5. The semiconductor structure of claim 3, wherein a ratio of a thickness of the oxide to a thickness of the bit line contact structures is within a predetermined value interval.

6. The semiconductor structure of claim 5, wherein the predetermined value interval is ($\frac{1}{4}$, $\frac{1}{2}$).

7. The semiconductor structure of claim 1, wherein the bit line conducting layers comprise metal barrier layers and metal conducting layers, the metal barrier layers cover surfaces of the bit line contact layers and the insulating layers, and the metal conducting layers cover the surfaces of the metal barrier layers.

8. The semiconductor structure of claim 7, wherein a material for the metal barrier layers comprises titanium nitride and a material for the metal conducting layers comprises tungsten.

9. The semiconductor structure of claim 1, further comprising:
dielectric layers, which cover surfaces of the bit line conducting layers.

10. The semiconductor structure of claim 9, wherein a material for the dielectric layers comprises silicon nitride.

11. A memory, comprising the semiconductor structure of claim 1.

12. A manufacturing method of a semiconductor structure, comprising:
providing a substrate, wherein buried word lines and a plurality of active areas arranged in an array are provided in the substrate, each of the active areas intersects with two of the buried word lines, grooves are provided in an upper surface of the substrate by etching, and each of the grooves is located between two of the buried word lines in each of the active areas;
depositing bit line contact layers and insulating layers, wherein the bit line contact layers fill the grooves, and the insulating layers are distributed between two of the grooves;
selectively etching the insulating layers, so that a thickness between upper surfaces of the insulating layers and the upper surface of the substrate is smaller than a thickness between upper surfaces of the bit line contact layers and the upper surface of the substrate; and
depositing bit line conducting layers, wherein the bit line conducting layers cover the bit line contact layers and the insulating layers.

13. The manufacturing method of claim 12, wherein a material for the bit line contact layers comprises polysilicon which fills the grooves and is distributed over the grooves to form bit line contact structures.

14. The manufacturing method of claim 13, wherein the insulating layers are formed from an oxide which is filled between two of the bit line contact structures; and
the selectively etching the insulating layers comprises:
etching the oxide, so that a thickness between an upper surface of the oxide and the upper surface of the substrate is smaller than a thickness between upper surfaces of the bit line contact structures and the upper surface of the substrate.

15. The manufacturing method of claim 14, wherein the bit line conducting layers cover the upper surface of the oxide, the upper surfaces of the bit line contact structures and part of side walls of the bit line contact structures.

16. The manufacturing method of claim 14, wherein a ratio of a thickness of the oxide to a thickness of the bit line contact structures is within a predetermined value interval.

17. The manufacturing method of claim 16, wherein the predetermined value interval is ($\frac{1}{4}$, $\frac{1}{2}$).

18. The manufacturing method of claim 12, wherein the bit line conducting layers comprise metal barrier layers and metal conducting layer; and
the depositing bit line conducting layers comprises:
depositing the metal barrier layers on surfaces of both the bit line contact layers and the insulating layers; and
depositing the metal conducting layers on surfaces of the metal barrier layers.

19. The manufacturing method of claim 18, wherein a material for the metal barrier layers comprises titanium nitride and a material for the metal conducting layers comprises tungsten.

20. The manufacturing method of claim 12, further comprising, after depositing bit line conducting layers:
 depositing dielectric layers, which cover surfaces of the bit line conducting layers, wherein a material for the dielectric layers comprises silicon nitride.

* * * * *